(12) United States Patent
Selvamanickam

(10) Patent No.: US 10,832,843 B2
(45) Date of Patent: Nov. 10, 2020

(54) SUPERCONDUCTOR COMPOSITIONS

(71) Applicant: The University of Houston System, Houston, TX (US)

(72) Inventor: Venkat Selvamanickam, Houston, TX (US)

(73) Assignee: The University of Houston System, Houston, TX (US)

( * ) Notice: Subject to any disclaimer, the term of this patent is extended or adjusted under 35 U.S.C. 154(b) by 146 days.

(21) Appl. No.: 15/559,298

(22) PCT Filed: Mar. 17, 2016

(86) PCT No.: PCT/US2016/022955
§ 371 (c)(1),
(2) Date: Sep. 18, 2017

(87) PCT Pub. No.: WO2016/149543
PCT Pub. Date: Sep. 22, 2016

(65) Prior Publication Data
US 2018/0061542 A1 Mar. 1, 2018

Related U.S. Application Data

(60) Provisional application No. 62/134,240, filed on Mar. 17, 2015.

(51) Int. Cl.
| | |
|---|---|
| *H01F 6/06* | (2006.01) |
| *H01L 39/12* | (2006.01) |
| *H01L 39/14* | (2006.01) |
| *H01L 39/24* | (2006.01) |
| *H01F 41/04* | (2006.01) |
| *H01B 1/02* | (2006.01) |
| *C23C 16/02* | (2006.01) |
| *C23C 16/40* | (2006.01) |

(Continued)

(52) U.S. Cl.
CPC ............... *H01F 6/06* (2013.01); *C23C 14/18* (2013.01); *C23C 14/35* (2013.01); *C23C 16/0272* (2013.01); *C23C 16/408* (2013.01); *C25D 13/02* (2013.01); *C30B 25/183* (2013.01); *C30B 29/22* (2013.01); *H01B 1/02* (2013.01); *H01B 1/08* (2013.01); *H01F 1/147* (2013.01); *H01F 41/048* (2013.01); *H01L 39/126* (2013.01); *H01L 39/143* (2013.01); *H01L 39/2441* (2013.01)

(58) Field of Classification Search
CPC ............ H01F 6/06; C23C 14/18; C23C 14/35
See application file for complete search history.

(56) References Cited

U.S. PATENT DOCUMENTS

| | | | | |
|---|---|---|---|---|
| 2004/0266628 A1* | 12/2004 | Lee | ...................... | H01L 39/143 505/238 |
| 2005/0159298 A1* | 7/2005 | Rupich | ............... | H01L 39/2425 502/100 |

(Continued)

*Primary Examiner* — Paul A Wartalowicz
(74) *Attorney, Agent, or Firm* — Blank Rome LLP

(57) ABSTRACT

A superconductor tape may be fabricated via Metal Organic Chemical Vapor Deposition (MOCVD) to achieve peel strengths greater than approximately 4.5 N/cm. The superconductor tape may be fabricated via MOCVD with a REBCO composition that includes the elements Samarium (Sm)-Barium(Ba)-Copper(Cu)-Oxygen(O). Varying levels of Copper (Cu) content can achieve peel strengths ranging between approximately 4.5 N/cm to approximately 8.0 N/cm.

15 Claims, 7 Drawing Sheets

(51) Int. Cl.
*H01B 1/08* (2006.01)
*C23C 14/18* (2006.01)
*C23C 14/35* (2006.01)
*C25D 13/02* (2006.01)
*C30B 25/18* (2006.01)
*C30B 29/22* (2006.01)
*H01F 1/147* (2006.01)

(56) References Cited

U.S. PATENT DOCUMENTS

| | | |
|---|---|---|
| 2005/0227064 A1 | 10/2005 | Jin |
| 2010/0173784 A1* | 7/2010 | Lee ................. H01L 39/143 505/237 |
| 2011/0028328 A1 | 2/2011 | Selvamanickam |
| 2012/0122697 A1 | 5/2012 | Miyazaki |
| 2013/0040821 A1* | 2/2013 | Okayama ................. C22C 9/00 505/239 |

* cited by examiner

SUPERCONDUCTOR COMPOSITIONS

CROSS-REFERENCES TO RELATED APPLICATIONS

This application is a national phase of PCT/US16/22955, filed Mar. 17, 2016, which claims priority to U.S. provisional patent application No. 62/134,240, filed on Mar. 17, 2015, the contents of which are hereby incorporated herein by reference in their entirety.

GOVERNMENT SPONSORSHIP

None.

FIELD OF THE DISCLOSURE

This disclosure relates to superconducting tapes, and more specifically to superconducting tapes having high peel strengths.

BACKGROUND

Several materials systems are being developed to solve the looming problems associated with energy generation, transmission, conversion, storage, and use. Superconductors are a unique system that provides a solution across a broad spectrum of energy problems. Superconductors enable high efficiencies in generators, power transmission cables, motors, transformers and energy storage. Furthermore, superconductors transcend applications beyond energy to medicine, particle physics, communications, and transportation.

Superconducting tapes are becoming more and more popular. This is in part due to successful fabrication techniques that create epitaxial, single-crystal-like thin films on polycrystalline substrates (Y. Iijima, et al, "Biaxially aligned $YBa_2Cu_3O_{7-x}$ thin film tapes," Physica C 185, 1959 (1991); X. D. Wu, et al. "Properties of $YBa_2Cu_3O_{7-\delta}$ thick films on flexible buffered metallic substrates," Appl. Phys. Lett. 67, 2397 (1995); A. Goyal, et al., "High critical current density superconducting tapes by epitaxial deposition of $YBa_2Cu_3O_x$ thick films on biaxially textured metals," Appl. Phys. Lett. 69 (1996) p. 1795; V. Selvamanickam, et al., "High Performance 2G wire: From R&D to Pilot-scale Manufacturing," IEEE Trans. Appl. Supercond. 19, 3225 (2009)). In this technique, a thin film of materials having a rock salt crystal structure (e.g., MgO) is deposited by ion-beam assisted deposition over flexible, polycrystalline substrates. Superconducting films that are processed by this technique exhibit critical current densities comparable to that achieved in epitaxial films grown on single crystal substrates. Using this technique, several institutions have demonstrated pilot-scale manufacturing of superconducting composite tapes. Remarkably, single crystal-like epitaxial films are now being manufactured at lengths exceeding 1 km using a polycrystalline substrate base.

FIGS. 1A-1B illustrate a schematic and cross-sectional microstructure of a prior art high-temperature superconducting (HTS) tape made via the afore-mentioned process. The tape typically includes several oxide films positioned on a metallic substrate and capped with silver and copper overlayers. One significant drawback of this design is that the structure is prone to debonding between the individual layers and delamination within the superconductor layer. Transverse tensile strength measurements on some conventional 2G HTS tapes, wherein a tensile stress is applied normal to the tape's surface, have shown evidence of weakness (Y. Yanagisawa, et al., "Remarkable weakness against cleavage stress for YBCO-coated conductors and its effect on the YBCO coil performance," Physica C 471, 480-485 (2011)). A uniform pull or stress may be imparted on the tape by means of Lorentz force acting mutually perpendicular to a transport current flowing through a superconducting tape in conjunction with an externally applied magnetic field. The fracture surfaces of the 2G HTS tape provide insight into the interfaces and films architecture or structures that are prone to debonding and delamination. More specifically, the interface between the $LaMnO_3$ (LMO) top buffer layer and the $REBa_2Cu_3O_x$ (REBCO) superconducting film has been found to be prone to debonding and the REBCO itself has been observed to be prone to delamination (i.e. cohesive failure) within the overall architecture of the HTS tape. Inhomogeneity in the superconductor film microstructure provides crack propagation paths that may result in reduced transverse tensile strength. Additionally, evidence of weak transverse strength in tapes in coils fabricated with epoxy impregnation has been observed (Y. Yanagisawa, et al., "Remarkable weakness against cleavage stress for YBCO-coated conductors and its effect on the YBCO coil performance," Physica C 471, 480-485 (2011); T. Takematsu, et al. "Degradation of the performance of a YBCO-coated conductor double pancake coil due to epoxy impregnation," Physica C, 470, 674-677 (2010)). The difference in thermal expansion coefficients of the tape and epoxy may result in the transverse stress on the tape. Thus, if the tolerance of the tape to this stress is low, then coil degradation may occur. Further, as a significant proportion of the applications of 2G HTS tape involve coil geometries, this mechanical weakness poses a significant problem in the deployment of 2G HTS tapes to these industries.

The delamination problem is even more problematic in multifilamentary HTS tapes where material between superconductor filaments is intentionally removed by methods such as laser ablation (I. Kesgin, et al., "Multifilament, copper-stabilized superconductor tapes with low alternating current loss," Appl. Phys. Lett., 103 (2013)), or wet chemical etching (X. Zhang, et al., "Delamination strength of YBCO coated conductors under transverse tensile stress," Supercond. Sci. Technol. 20, 765 (2007). For example, FIG. 2 shows a photograph of the top and bottom surfaces of a multifilamentary HTS tape. As illustrated, delamination has occurred both within the superconductor film and at the interface of the superconductor film and the buffer layer.

Thus, there is need in the art for methods and compositions that can achieve in superconductors improved transverse tensile strength and electrical properties for commercial applications.

SUMMARY

Disclosed herein is a superconducting tape architecture that can achieve high peel strengths. By way of example only, a superconducting tape disclosed herein can achieve a peel strength greater than approximately 4.5 N/cm. In one embodiment, the high peel strength superconducting tape is fabricated via Metal Organic Chemical Vapor Deposition (MOCVD). The superconducting tape can be fabricated with a REBCO composition. In one embodiment, the REBCO composition can be based on the elements Sm—Ba—Cu—O. In another embodiment, the high peel strength superconducting tape can be fabricated with a REBCO composition, including an additional dopant transition metal (M) (e.g., Zirconium (Zr), Tantalum (Ta), Tin (Sn), Hafnium (Hf) and Niobium (Nb)). In an embodiment, the Cu concentration can range from approximately 2.3 to approximately 2.6.

In one embodiment, a high peel strength superconducting tape can be fabricated via MOCVD with a precursor composition $Sm_{1.2}Ba_2Cu_xO_{7-z}$, where $0<z<1$. The Cu concentration can range from approximately 2.3 to approximately 2.6. In another embodiment, the superconducting tape can be fabricated via MOCVD with a precursor composition $Sm_{1.2}Ba_2Cu_xO_{7-z}:M_y$, where approximately $0<z<1$. The dopant transition metal (M) concentration can vary from approximately 0.05 to approximately 0.30 (e.g., 15% Zr). The Cu concentration can range from approximately 2.3 to approximately 2.6.

Additional embodiments and additional features of embodiments for the superconductor tape and method of fabricating the superconductor tape are described below and are hereby incorporated into this section.

BRIEF DESCRIPTION OF THE DRAWINGS

The foregoing summary, as well as the following detailed description, will be better understood when read in conjunction with the appended drawings. For the purpose of illustration only, there is shown in the drawings certain embodiments. It's understood, however, that the inventive concepts disclosed herein are not limited to the precise arrangements and instrumentalities shown in the figures.

DETAILED DESCRIPTION

Figure 1A:
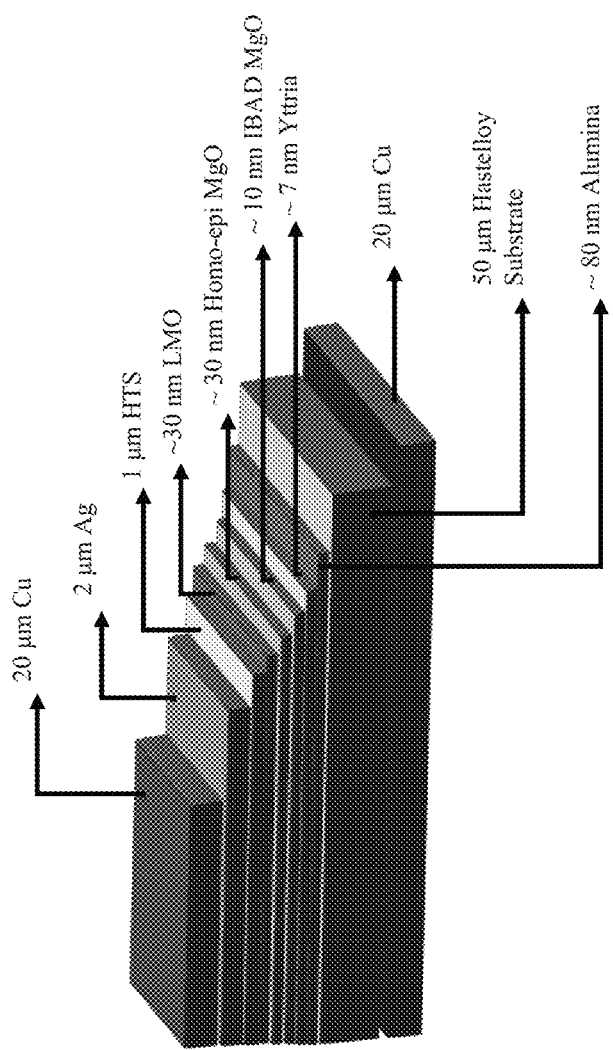
FIGS. 1A-1B illustrate a schematic and cross-sectional microstructure of a prior art thin film high-temperature superconducting tape.
Figure 1B:
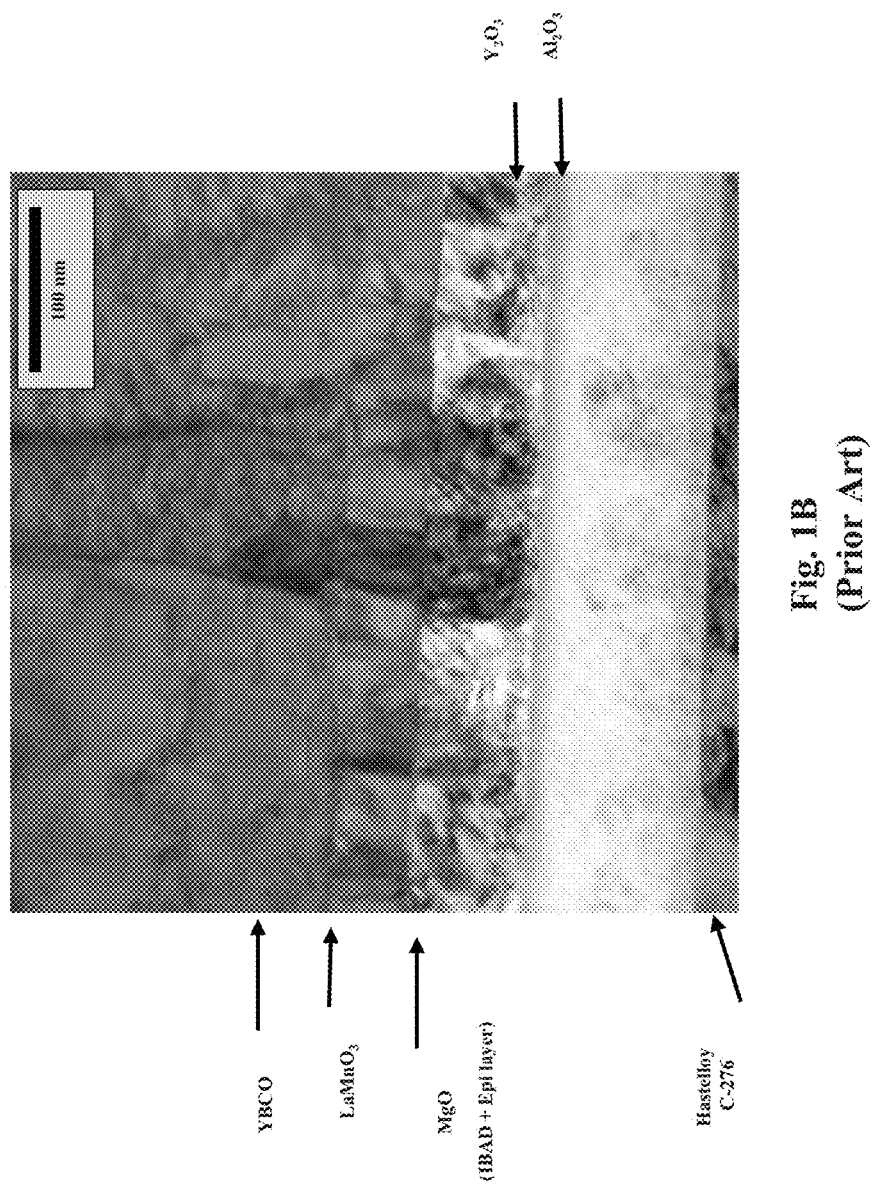
Figure 2:
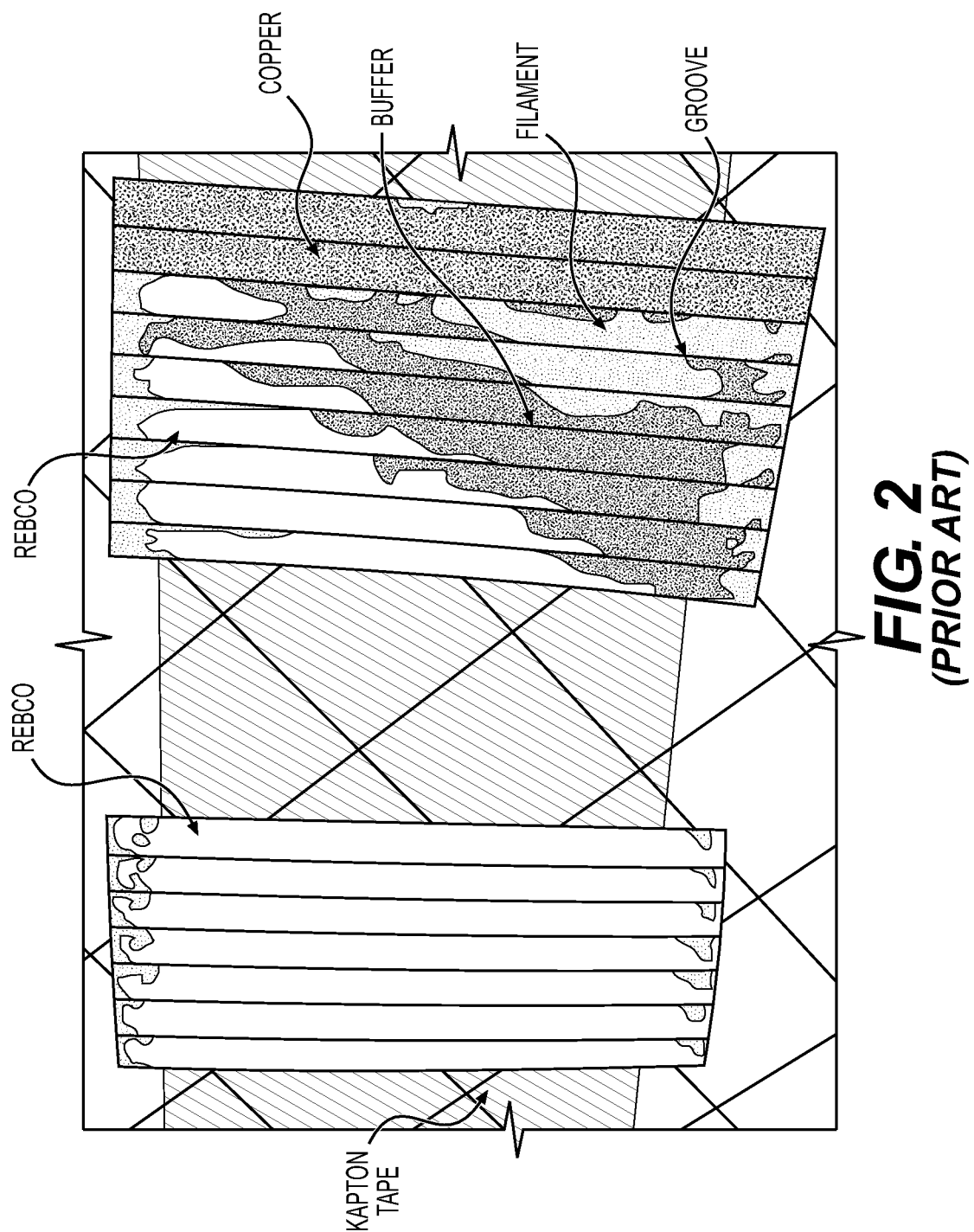
FIG. 2 illustrates delamination in a prior art multifilamentary thin film high-temperature superconducting tape.

It is to be understood that the figures and descriptions of the present invention may have been simplified to illustrate elements that are relevant for a clear understanding of the present embodiments, while eliminating, for purposes of clarity, other elements found in a typical superconductor tape or typical method for fabricating a superconductor tape. Those of ordinary skill in the art will recognize that other elements may be desirable and/or required in order to implement the present embodiments. However, because such elements are well known in the art, and because they do not facilitate a better understanding of the present embodiments, a discussion of such elements is not provided herein. It is also to be understood that the drawings included herewith only provide diagrammatic representations of the presently preferred structures of the present invention and that structures falling within the scope of the present embodiments may include structures different than those shown in the drawings. Reference will now be made to the drawings wherein like structures are provided with like reference designations.

Before explaining at least one embodiment in detail, it should be understood that the inventive concepts set forth herein are not limited in their application to the construction details or component arrangements set forth in the following description or illustrated in the drawings. It should also be understood that the phraseology and terminology employed herein are merely for descriptive purposes and should not be considered limiting.

It should further be understood that any one of the described features may be used separately or in combination with other features. Other invented systems, methods, features, and advantages will be or become apparent to one with skill in the art upon examining the drawings and the detailed description herein. It's intended that all such additional systems, methods, features, and advantages be protected by the accompanying claims.

For purposes of this disclosure, the terms "film" and "layer" may be used interchangeably.

It is an objective of the embodiments described herein to achieve an HTS tape with superior resistance to delamination, hereinafter referred to as a "peel strength."

In an embodiment, an HTS tape is fabricated via MOCVD with a REBCO composition based on the element Samarium (Sm). For example, the REBCO composition may be Sm—Ba—Cu—O. In another embodiment, the REBCO composition may include at least one dopant transition metal M that can form the composition $BaMO_3$, such as Zirconium (Zr), Tantalum (Ta), Tin (Sn), Hafnium (Hf) and Niobium (Nb). In yet another embodiment, the REBCO composition may include varying levels of Copper (Cu) content. In still another embodiment, REBCO compositions that include samarium, a dopant transition metal (e.g., Zr), and/or varying levels of Cu content can considerably strengthen the interfacial adhesion of the REBCO and buffer and the cohesive strength of the REBCO film.

In one embodiment, the cations in the chemical precursors used to fabricate the REBCO film can have the composition $Sm_{1.2}Ba_2Cu_xO_{7-z}$, where $0<z<1$. The Cu concentration can range from approximately 2.3 to approximately 2.6. In another embodiment, the REBCO film can include an addition of a dopant transition metal M that can form $BaMO_3$ (e.g., Zr, Ta, Sn, Hf, Nb). By way of example only, for example, the precursors used to make the REBCO film can have the composition $Sm_{1.2}Ba_2Cu_xO_{7-z}:M_y$, where approximately $0<z<1$, and M is a dopant transition metal that can form $BaMO_3$ (e.g., Zr, Ta, Sn, Hf, Nb). The Cu concentration can range from approximately 2.3 to approximately 2.6. The Zr concentration can vary from approximately 0.05 to approximately 0.30, such as 15% Zr.

Figure 3A:
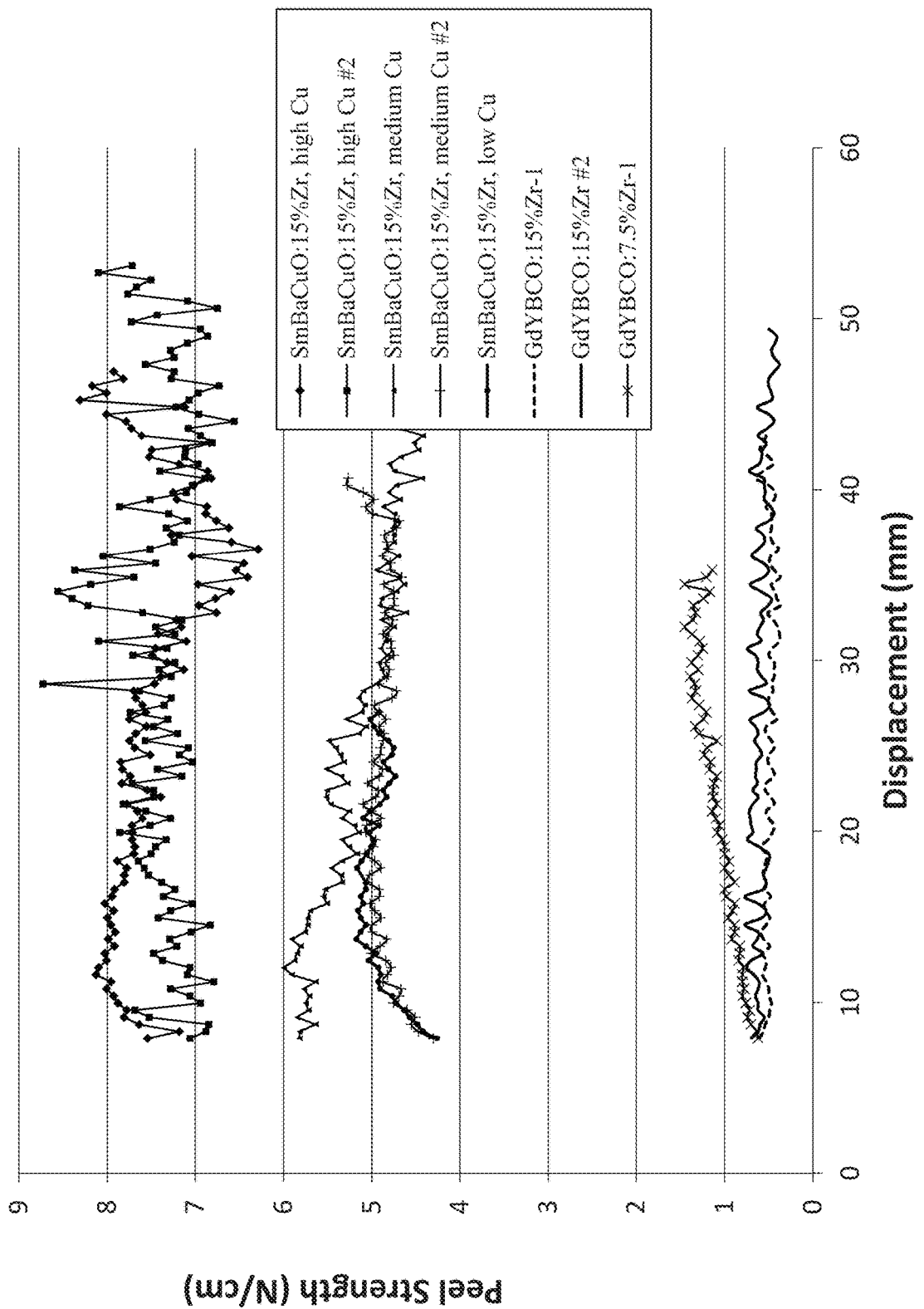
FIGS. 3A-3B illustrate peel strengths for superconducting tapes having various compositions, in accordance with an embodiment.
Figure 3B:
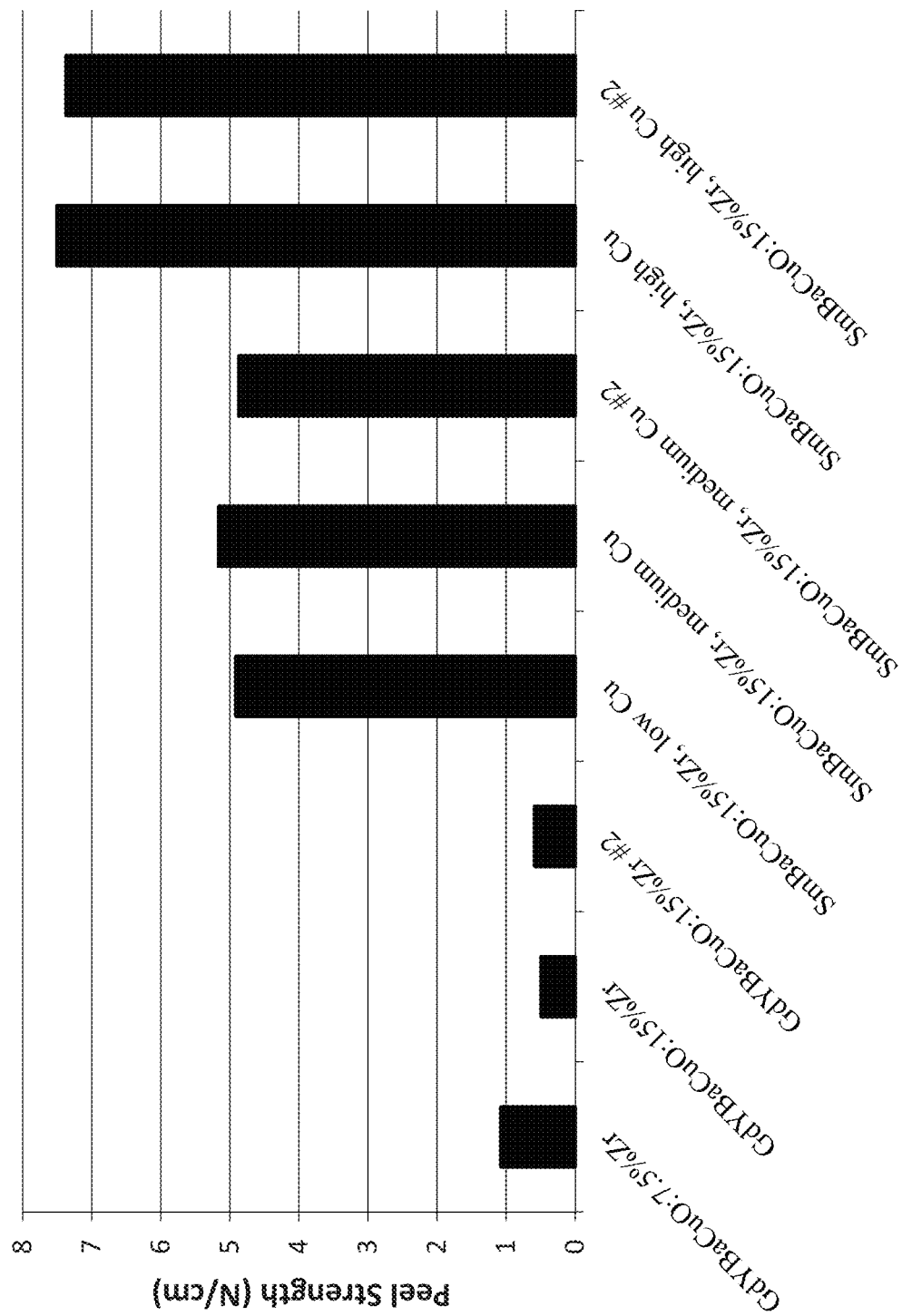

In another embodiment, REBCO films fabricated via MOCVD can exhibit peel strengths greater than 3 N/cm. For example, in one embodiment, REBCO films made with precursors having the cation composition $Sm_{1.2}Ba_2Cu_xO_{7-z}:Zr_{0.15}$, where x ranges from approximately 2.3 to approximately 2.6 and approximately $0<z<1$, can exhibit a peel strength greater than 3 N/cm. FIG. 3A illustrates load-displacement curves for super conductor tapes having standard compositions (e.g., (Gd,Y)Ba—Cu—O with 15% or 7.5% Zr addition) versus tapes made with precursors of novel cation compositions described herein, i.e. $Sm_{1.2}Ba_2Cu_xO_{7-z}:Zr_{0.15}$, where x is 2.3 to 2.6 (low=2.3, medium=2.4-2.5, high=2.6) and $0<z<1$. FIG. 3B shows the mean peel strength of these superconducting tapes. As shown in these figures, the HTS tapes constructed herein have considerably higher peel strengths than standard tapes. In an embodiment, tapes made with cation composition $Sm_{1.2}Ba_2Cu_xO_{7-z}:Zr_{0.15}$, where x ranges from approximately 2.3 to approximately 2.6 and approximately $0<z<1$, can have an average peel strength between approximately 4.5 N/cm and approximately 8.0 N/cm. In another embodiment, an HTS tape made with precursors of cation composition $Sm_{1.2}Ba_2Cu_{2.6}O_{7-z}:Zr_{0.15}$ where approximately $0<z<1$, can exhibit an average peel strength of between approximately 7 and approximately 8 N/cm. On the other hand, HTS tapes made with standard composites exhibit peel strengths less than approximately 2 N/cm.

Figure 4:
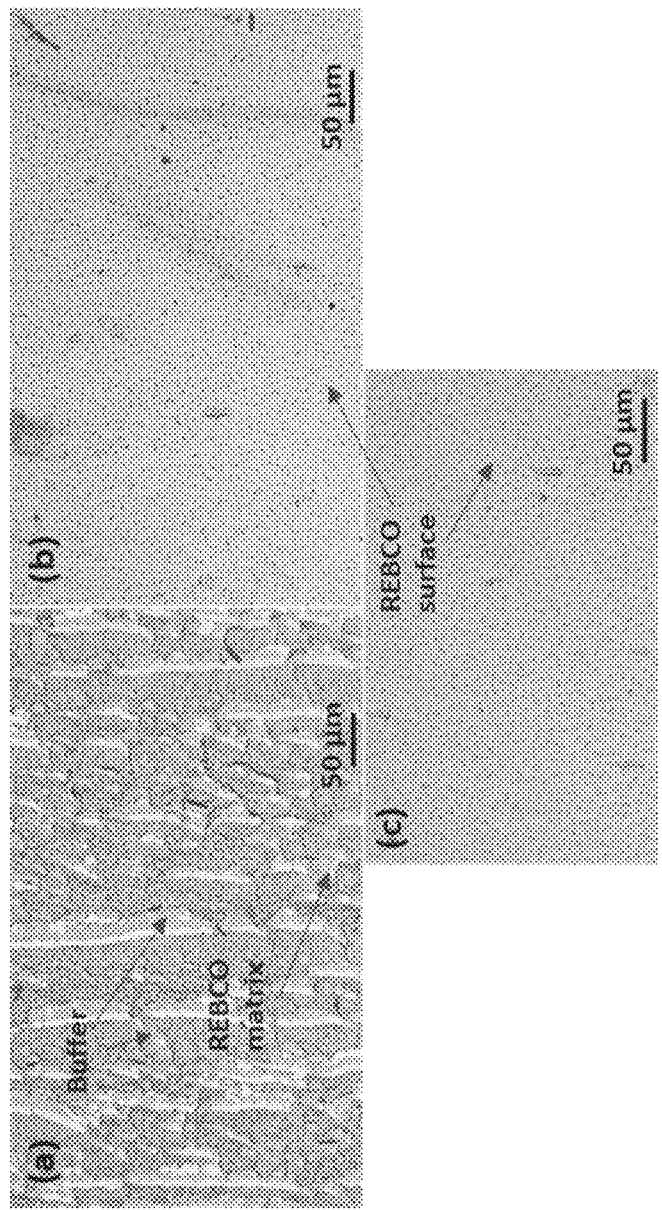
FIGS. 4A-4C illustrate optical microscopy images of HTS tapes following a peel test, in accordance with an embodiment.

FIG. 4A illustrates an optical microscopy image of a standard tape, (Gd,Y)—Ba—Cu—O with 15% Zr addition, following a peel test. As shown in FIG. 4A, in a standard tape the delamination propagates through the buffer/REBCO interface (i.e. adhesive failure) and through the HTS film (i.e. cohesive failure). The crack is initiated at the weakest point and it propagates from one layer as peeling progresses. Two-thirds of the peeled surface exhibits cohesive delamination within the HTS film, and one-third of the peeled surface exhibits delamination at the buffer-HTS film interface. For delamination at the buffer-HTS interface, the delamination shifts from one buffer to another as evident by the varying shades of grey color.

FIG. 4B illustrates an optical image microscopy of an HTS tape fabricated via MOCVD with precursors of cation composition $Sm_{1.2}Ba_2Cu_{2.4}O_{7-z}:Zr_{0.15}$, where approximately $0<z<1$, following a peel test. FIG. 4C illustrates an optical image microscopy of an HTS tape fabricated via MOCVD having the composition $Sm_{1.2}Ba_2Cu_{2.5}O_{7-z}:Zr_{0.15}$, where approximately $0<z<1$, following a peel test. As illustrated in these figures, in an embodiment, there is insignificant delamination within the HTS films or at the buffer-HTS interfaces. In another embodiment, any delamination occurs primarily at the HTS film-silver overlayer interface.

In an embodiment, the above-described REBCO compositions are fabricated via Metal Organic Chemical Vapor Deposition (MOCVD), which is a well-known fabrication process used to produce thin films.

The method steps in any of the embodiments described herein are not restricted to being performed in any particular order. Also, structures mentioned in any of the method embodiments may utilize structures mentioned in any of the device embodiments. Such structures may be described in detail with respect to the device embodiments only but are applicable to any of the method embodiments.

Features in any of the embodiments described above may be employed in combination with features in other embodiments described above, such combinations are considered to be within the spirit and scope of the present invention.

The contemplated modifications and variations specifically mentioned above are considered to be within the spirit and scope of the present invention.

It's understood that the above description is intended to be illustrative, and not restrictive. The material has been presented to enable any person skilled in the art to make and use the concepts described herein, and is provided in the context of particular embodiments, variations of which will be readily apparent to those skilled in the art (e.g., some of the disclosed embodiments may be used in combination with each other). Many other embodiments will be apparent to those of skill in the art upon reviewing the above description. The scope of the embodiments herein therefore should be determined with reference to the appended claims, along with the full scope of equivalents to which such claims are entitled. In the appended claims, the terms "including" and "in which" are used as the plain-English equivalents of the respective terms "comprising" and "wherein."

EXAMPLES

Synthesizing REBCO Tape.

The superconductor films were grown epitaxially on $LaMnO_3$-terminated biaxially-textured buffer layers of MgO fabricated by ion beam assisted deposition on Hastelloy C276 substrates, 50 μm in thickness and 12 mm in width. All films, including the superconductor, were grown by reel-to-reel thin film processes. Metal Organic Chemical Vapor Deposition (MOCVD) with a liquid precursor delivery system was used to grow (Gd,Y)BaCuO and SmBaCuO films with 15% Zr addition. Standard tetramethyl heptanedionate (thd) precursors were used for all components including Zr. The cation compositions of the precursors were $Sm_{1.2}Ba_2Cu_xO_{7-z}:Zr_{0.15}$, where x was varied from 2.3 to 2.6 and $0<z<1$. A single solution was prepared by dissolving all thd precursors together in tetrahydrofuran. The precursor solution was vaporized in a flash evaporator and the vapor was deposited on buffered metal substrates in a MOCVD reactor with a linear showerhead. The superconductor film thickness was controlled by the substrate tape movement speed.

After deposition of the superconductor film, a silver overlayer of thickness of about 1.5 μm was deposited by magnetron sputtering. The tape was then oxygenated at 400-500° C. for 0.5 hours. Typically, a copper stabilizer having a thickness of about 20 μm is electroplated all around the tape. For delamination testing purposes, however, a 20 μm copper stabilizer was deposited only on the silver overlayer above the superconductor film. Furthermore, for this study to be a true representation of tape adhesion strength, 1 mm from both edges of each sample was sheared off prior to the peel tests yielding a total sample width of 1 cm.

T Peel Test.

Figure 5:
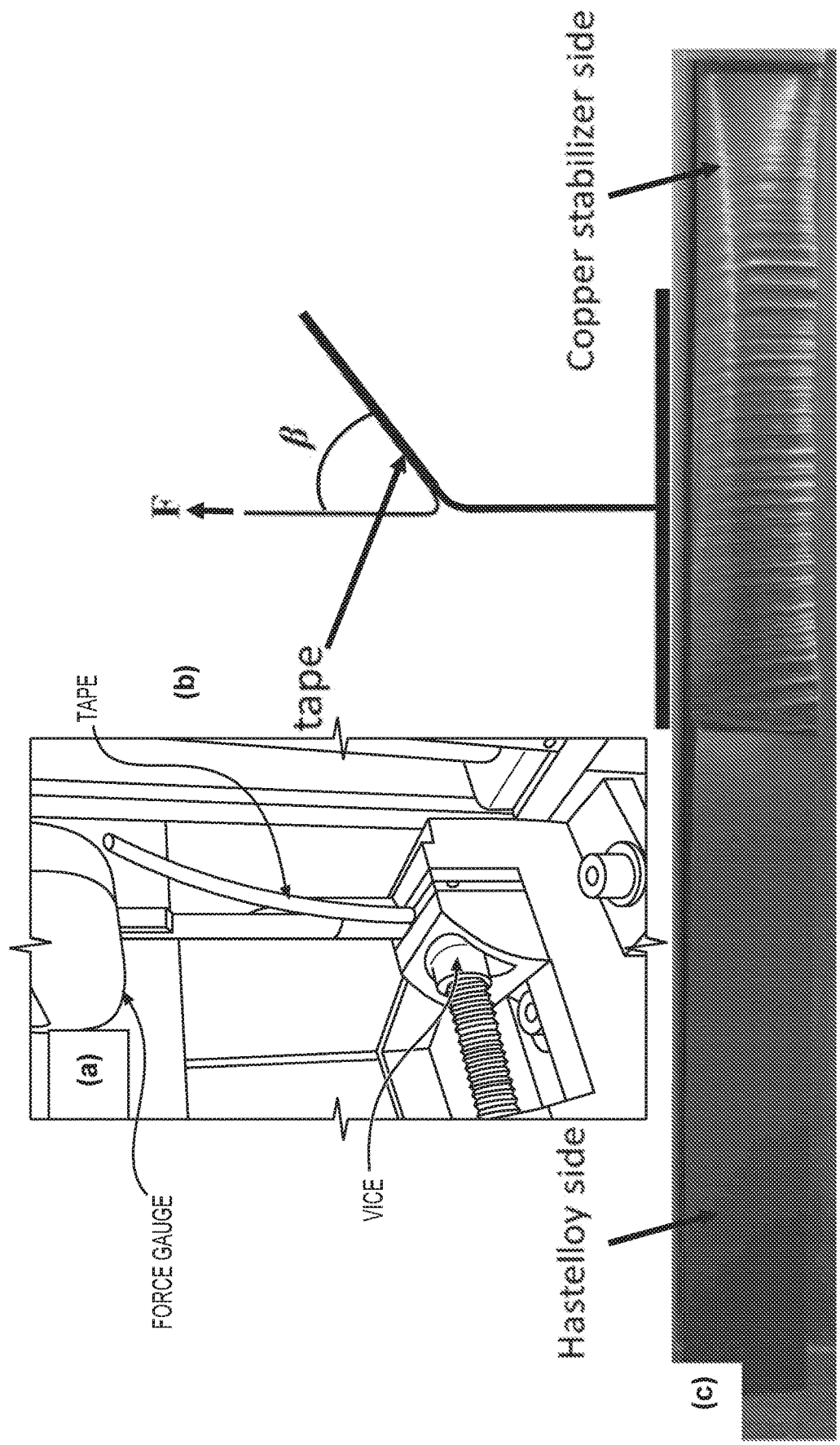
FIGS. 5A-5C respectively illustrate a T peel test, schematic of a peel test and tape surfaces following a peel test, in accordance with an embodiment.

Many techniques have been used to evaluate the adhesive behavior of thin films, including the anvil test (G. Majkic, et al., "Investigation of Delamination Mechanisms in IBAD-MOCVD REBCO Coated Conductors," *IEEE Trans. Appl. Supercond.* 23, 6600205 (2013), the pin-pull test (J. W. Ekin, S. L. Bray, N. Cheggour, C. C. Clickner, S. R. Foltyn, P. N. Arendt, A. A. Polyanskii, D. C. Larbalestier et al, "Transverse stress and fatigue effects in Y—Ba—Cu—O coated IBAD tapes," *IEEE Trans. Appl. Supercond.* 11, 3389 (2001); M. Sugano, et al., "Reversible strain dependence of critical current in 100 a class coated conductors, Applied Superconductivity," *IEEE Trans. Appl. Supercond.* 15, 3581 (2005); T. Miyazato, et al., "Mode I type delamination fracture toughness of YBCO coated conductor with additional Cu layer," *Physica C* 471, 1071 (2011)), the cleavage test (Y. Yanagisawa, et al., "Remarkable weakness against cleavage stress for YBCO-coated conductors and its effect on the YBCO coil performance," *Physica C* 471, 480-485 (2011)), the double cantilever beam test (DCB) mode I type delamination behavior (N. Sakai, et al., "Delamination behavior of Gd123 coated conductor fabricated by PLD," *Physica C* 471, 1075 (2011), and the four point bending test (Y. Zhang, et al., "Adhesion strength study of IBAD MOCVD-based 2G HTS wire using a peel test," *Physica C* 473, 41-47 (2012)). However, these tests tend to produce transverse strength data that does not correlate well with the actual failure history of coils (Y. Zhang, et al., "Adhesion strength study of IBAD MOCVD-based 2G HTS wire using a peel test," *Physica C* 473, 41-47 (2012)). Peel strength tests, however, have been shown to correlate well with the failure history of coil performance. A T peel test was used to measure the delamination resistance of the HTS tapes having the compositions described herein. FIGS. 5A-5B illustrate a peel test and a schematic of the peel test. Prior to pulling, the top layer of the delaminated tape was glued to a moving force meter, and the bottom layer was held stationary by a vice. The sample was manually delaminated from the weakest layer. The peeling angle β can vary depending on the force exerted on the peeled region and the remaining length of the sample. The total length of the peeled region ranges from 35-70 mm. A digital force gauge was used to measure the load required to peel the HTS tapes at a constant loading displacement speed of 0.833 mm/s. Load displacement curves were generated based on the peel data.

FIG. 5C shows an HTS tape after conducting the peel test. The microstructure of the surfaces of the tape after peeling can be examined to determine the mode of delamination.

What is claimed is:

1. A superconductor tape comprising:
   a substrate;
   a buffer layer overlying the substrate; and
   a superconductor layer overlying the buffer layer, wherein the superconductor tape exhibits a peel strength greater than 3 N/cm, and wherein the peel strength is determined by the superconductor layer or by an interface between the superconductor layer and a layer adjacent to the superconductor layer.

2. The superconductor tape of claim 1, wherein the superconductor layer comprises Samarium (Sm), Barium (Ba), Copper (Cu), and Oxygen (O).

3. The superconductor tape of claim 2, wherein the superconductor tape further comprises at least one dopant transition metal (M).

4. The superconductor tape of claim 3, wherein the dopant transition metal consists of at least one of Zirconium (Zr), Tantalum (Ta), Tin (Sn), Hafnium (Hf) and Niobium (Nb).

5. A superconductor coil, comprising the superconductor tape of claim 1.

6. The superconductor tape of claim 1, wherein the peel strength is greater than 4.5 N/cm.

7. The superconductor tape of claim 1, wherein the layer adjacent to the superconductor layer is the buffer layer.

8. The superconductor tape of claim 1, wherein the superconductor tape further comprises a silver overlayer above the superconductor layer, and wherein the layer adjacent to the superconductor layer is the silver overlayer.

9. A method of fabricating a superconductor tape, comprising:
   depositing on a substrate a buffer layer;
   growing epitaxially on the buffer layer a superconductor layer comprising elements selected to achieve a peel strength greater than approximately 3 N/cm, wherein the peel strength is determined by the superconductor layer or by an interface between the superconductor layer and a layer adjacent to the superconductor layer;
   depositing a silver overlayer on the superconductor layer; and
   electroplating a copper stabilizer substantially around the surfaces of the tape.

10. The method of claim 9, wherein the superconductor layer consists of Samarium (Sm), Barium (Ba), Copper (Cu), and Oxygen (O).

11. The method of claim 10, wherein the superconductor tape further comprises at least one dopant transition metal (M).

12. The method of claim 11, wherein the dopant transition metal consists of at least one of Zirconium (Zr), Tantalum (Ta), Tin (Sn), Hafnium (Hf) and Niobium (Nb).

13. The method of claim 9, wherein the peel strength is greater than 4.5 N/cm.

14. The method of claim 9, wherein the layer adjacent to the superconductor layer is the buffer layer.

15. The method of claim 9, wherein the layer adjacent to the superconductor layer is the silver overlayer.

* * * * *